United States Patent [19]

Chan et al.

[11] Patent Number: 4,886,644
[45] Date of Patent: Dec. 12, 1989

[54] LIQUID DEGASER IN AN EBULLATED BED PROCESS

[75] Inventors: Ting Y. Chan; James H. Colvert, both of Houston, Tex.

[73] Assignee: Texaco Inc., White Plains, N.Y.

[21] Appl. No.: 127,851

[22] Filed: Dec. 2, 1987

[51] Int. Cl.$^4$ .............................................. B01J 8/20
[52] U.S. Cl. ...................................... 422/140; 55/184; 55/398; 422/147
[58] Field of Search ...................... 422/147, 140, 146; 55/184, 398

[56] References Cited

U.S. PATENT DOCUMENTS

| Re. 25,770 | 4/1965 | Johanson | 208/10 |
| 2,446,882 | 8/1948 | Morrison | 183/34 |
| 2,754,182 | 7/1956 | Ruth | 422/115 X |
| 2,959,534 | 11/1960 | Fogle | 422/143 X |
| 3,414,386 | 12/1968 | Mattix | 422/140 X |
| 3,523,763 | 8/1970 | Van Driesen et al. | 422/140 X |
| 3,668,116 | 6/1972 | Adams et al. | 208/216 |
| 3,895,930 | 7/1975 | Campolong | 55/394 |
| 4,012,314 | 3/1977 | Goldberger et al. | 208/251 |
| 4,151,073 | 4/1979 | Comolli | 208/340 |
| 4,221,653 | 9/1980 | Chervenak et al. | 422/140 X |
| 4,280,825 | 7/1981 | Marjollet et al. | 55/203 |
| 4,311,494 | 1/1982 | Conner et al. | 55/394 |
| 4,354,852 | 10/1982 | Kydd | 23/230 |
| 4,482,364 | 11/1984 | Martin et al. | 55/184 X |
| 4,810,359 | 3/1989 | Sayles et al. | 208/143 |

OTHER PUBLICATIONS

Chemical Engineering, *Motionless Mixers for Viscous Polymers;* Chen; S. J. and MacDonald; A. R.; Mar. 19, 1973, pp. 105–111.

*Primary Examiner*—Barry S. Richman
*Assistant Examiner*—Amalia L. Santiago
*Attorney, Agent, or Firm*—Jack H. Park; Kenneth R. Priem; Richard A. Morgan

[57] ABSTRACT

In an ebullated bed reactor it has been found that an improved gas-liquid separator effectively removes gas from recycle liquid used to ebullate the catalyst bed. The gas-liquid separator comprises a cup with a plurality of riser conduits. Helical members are positioned within the riser conduits which impart a tangential velocity component to the fluid. Cyclone separators effect the final liquid-vapor separation. Vapor is directed to a vapor rich zone in the reactor.

2 Claims, 2 Drawing Sheets

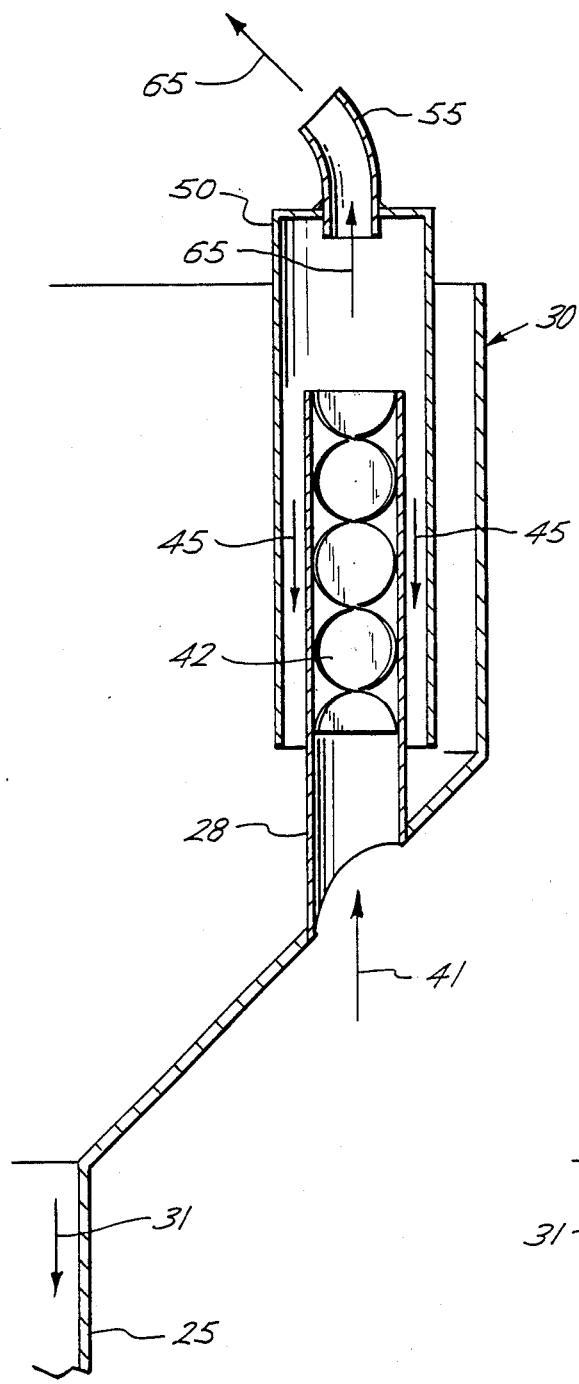
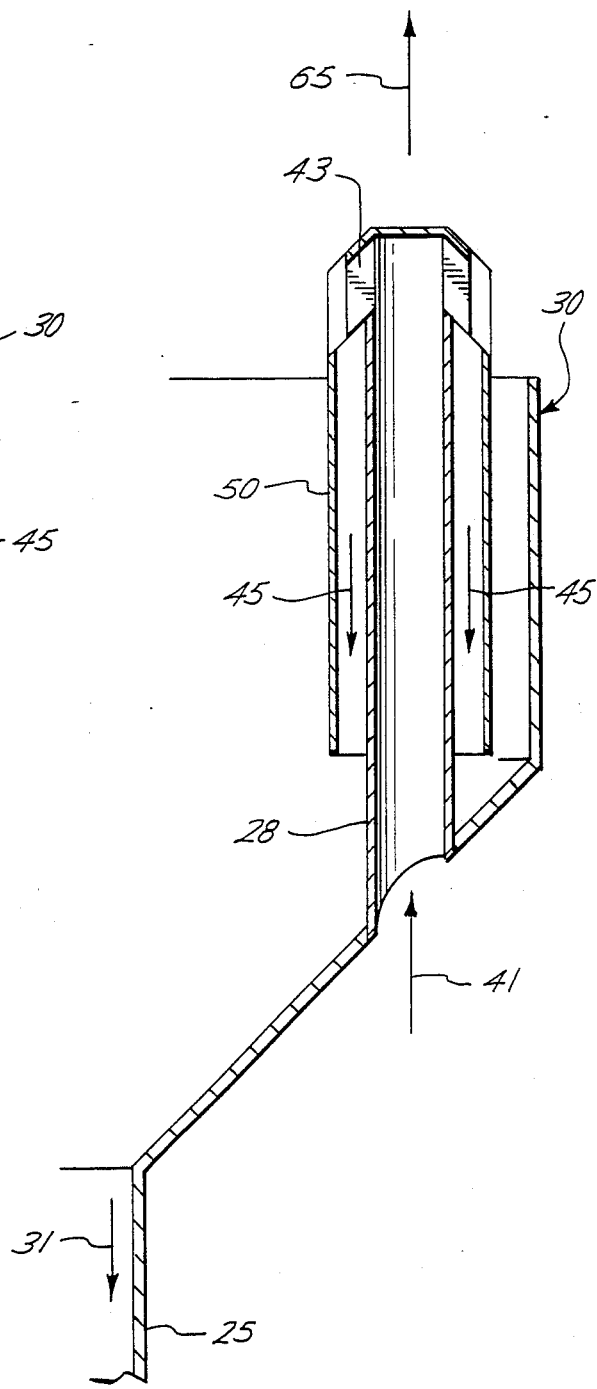

LIQUID DEGASER IN AN EBULLATED BED PROCESS

BACKGROUND OF THE INVENTION

1. Field of the Invention

This invention relates to an improved recycle vapor-liquid separator in an ebullated bed process. The separator comprises a cup with a plurality of riser conduits. Specifically, the invention relates to an additional separation stage comprising cyclone separators to degas recycle liquid.

2. Description of Other Relevant Methods in the Field

The ebullated bed process comprises the passing of concurrently flowing streams of liquids or slurries of liquids and solids and gas through a vertically cylindrical vessel containing catalyst. The catalyst is placed in random motion in the liquid and has a gross volume dispersed through the liquid medium greater than the volume of the mass when stationary. This technology has found commercial application in the upgrading of heavy liquid hydrocarbons or converting coal to synthetic oils.

The process is generally described in U.S. Re. Pat. No. 25,770 to Johanson incorporated herein by reference. A mixture of hydrocarbon liquid and hydrogen is passed upwardly through a bed of catalyst particles at a rate such that the particles are forced into random motion as the liquid and gas pass upwardly through the bed. The catalyst bed motion is controlled by a recycle liquid flow so that at steady state, the bulk of the catalyst does not rise above a definable level in the reactor. Vapors along with the liquid which is being hydrogenated pass through that upper level of catalyst particles into a substantially catalyst free zone and are removed at the upper portion of the reactor.

In an ebullated bed process the substantial amounts of hydrogen gas and light hydrocarbon vapors present rise through the reaction zone into the catalyst free zone. Liquid is both recycled to the bottom of the reactor and removed from the reactor as product from this catalyst free zone. Vapor is separated from the liquid recycle stream before being passed through the recycle conduit to the recycle pump suction. The recycle pump (ebullation pump) maintains the expansion (ebullation) and random motion of catalyst particles at a constant and stable level. Gases or vapors present in the recycled liquid materially decrease the capacity of the recycle pump as well as reduce the liquid residence time in the reactor and limit hydrogen partial pressure.

Reactors employed in a catalytic hydrogenation process with an ebullated bed of catalyst particles are designed with a central vertical recycle conduit which serves as the downcomer for recycling liquid from the catalyst free zone above the ebullated catalyst bed to the suction of a recycle pump to recirculate the liquid through the catalytic reaction zone. The recycling of liquid from the upper portion of the reactor serves to ebullate the catalyst bed, maintain temperature uniformity through the reactor and stabilize the catalyst bed.

U.S. Pat. No. 4,221,653 to Chervenak et al. describes an apparatus for separating vapor from liquid in an ebullated bed process. The apparatus comprises a frusto-conical cup in which are inserted a plurality of riser conduits. The conduits are positioned in two concentric circles within the cup. The generic term for the recycle gas-liquid separator apparatus in an ebullating bed process is a recycle cup. The recycle cup of the Chervenak et al. patent and those like it with a plurality of riser conduits are referred to as a tubular recycle cup.

It is a critical feature of the recycle cup that the up-flowing liquid-gas mixture rising from the reaction zone passes through the riser conduits of the separation apparatus and that lower ends of all conduits are below the reactor liquid level. After passage through the recycle cup, the gas portion rises to the top of the reactor. Part of the liquid portion is returned through a downcomer conduit and recycled to the reaction zone. The remaining liquid portion is withdrawn from the reactor as liquid product. The returned liquid portion passes through the recycle conduit to a recycle pump, then passes through a liquid-gas distribution means, together with fresh liquid and hydrogen feed to maintain uniform upward fluid flow through the ebullated catalyst bed. The liquid and vapor effluent may be withdrawn separately from the upper portion of the reactor. If withdrawn separately, a second interface between liquid and vapor is established. Vapor is withdrawn from above the interface. The liquid is withdrawn from a point in the reactor free of vapor. If desired, liquid and vapor portions may be withdrawn together through a single conduit extending into the reactor to a position adjacent the separator apparatus.

U.S. Pat. Nos. 4,151,073 to A. G. Comolli and 4,354,852 to P. H. Kydd recognize the advantages of effecting the recycle liquid-vapor separation in an ebullated bed process by feeding the fluid tangentially to a cylindrical separator. By this method, the hot fluid is fed to the cylindrical separator at conditions to prevent carbonaceous particulate material from depositing on the interior surface of the separator. These conditions include tangential injection of feed to the separator, fluid temperature of 550° F. to 900° F. and a separator length/diameter ratio of 20/1 to 50/1. The Kydd patent additionally teaches that a liquid vortex in the cylindrical separator reduces coke deposition.

The design of liquid cyclone separators is well known in the art. For example, U.S. Pat. Nos. 3,668,116 and 4,012,314 describe the use of a liquid cyclone in an ebullated bed process. An essential feature of any cyclone is tangential feed to a circumferential wall.

U.S. Pat. Nos. 2,446,882; 3,895,930; 4,280,825 and 4,311,494 describe separators comprising helices or fins in a conduit member.

BRIEF DESCRIPTION OF THE DRAWINGS

FIG. 2 is a cross-sectional view of a riser conduit comprising an internal helical tangential velocity inducing member and a cylindrical cyclone separator.

FIG. 3 is a cross-sectional view of a riser conduit comprising an external tangential velocity inducing member and a cyclone separator.

DETAILED DESCRIPTION OF THE DRAWINGS

Figure 1:
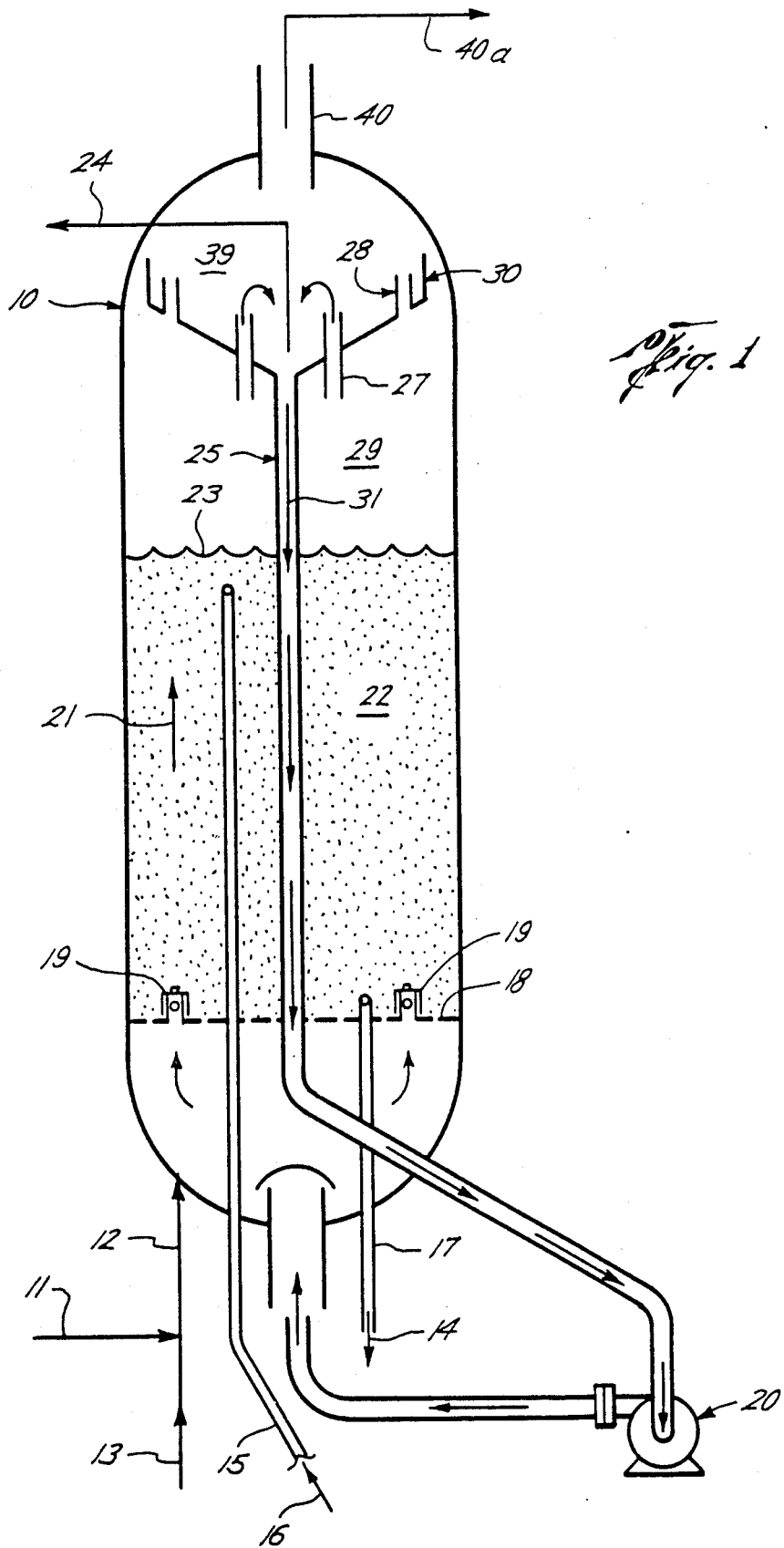
FIG. 1 is a sectional elevated view of a reaction vessel containing a tubular recycle cup vapor-liquid separation apparatus.

In order to demonstrate and provide a better understanding of the invention, reference is made to the drawings.

The inventoon is further illustrated by reference to FIG. 1. Reaction vessel 10 is positioned with its long axis in a vertical position and is generally of a circular cross section. Although this FIG. 1 drawing is schematic in order to show its various features, it will be understood that the reactor is constructed in such a fashion and from such materials that it is suitable for reacting liquids, liquid-solid slurries, solids and gases at elevated temperatures and pressures and in a preferred embodiment for treating hydrocarbon liquids with hydrogen at high pressures and high temperatures, e.g. 100 to 5000 psi and 300° F. to 1500° F. The reactor 10 is fitted with a suitable inlet conduit 12 for feeding heavy oil and a hydrogen-containing gas. Outlet conduits are located in the upper portion of reactor 10; outlet conduit 40 designed to withdraw vapor and liquid, and optionally outlet conduit 24 to withdraw mainly liquid product. The reactor also contains means for introducing and withdrawing catalyst particles, which are shown schematically as conduit 15 through which fresh catalyst 16 is flowed and conduit 17 through which spent catalyst 14 is withdrawn.

Heavy oil feedstock is introduced through conduit 11, while hydrogen-containing gas is introduced through conduit 13, and may be combined with the feedstock and fed into reactor 10 through conduit 12 in the bottom of the reactor. The incoming fluid passes through grid tray 18 containing suitable fluid distribution means. In this drawing, bubble caps 19 are shown as the fluid distribution means, but it is to be understood that any suitable device known in the art which will uniformly distribute the fluid coming from conduit 12 over the entire cross-sectional area of reactor 10 may be utilized.

The mixture of liquid and gas flows upwardly, and the catalyst particles are thereby forced into an ebullated movement by the gas flow and the liquid flow delivered by recycle pump 20 (ebullation pump) which may be either internal or external to the reactor 10. The upward liquid flow delivered by this recycle pump 20 is sufficient to cause the mass of catalyst particles in catalytic reaction zone 22 (catalyst bed) to expand by at least 10% and usually by 20 to 200% over the static volume, thus permitting gas and liquid flow as shown by direction arrow 21 through reactor 10. Due to the upwardly directed flow provided by the pump and the downward forces provided by gravity, the catalyst bed particles reach an upward level of travel or ebullation while the lighter liquid and gas continue to move upward beyond that level. In this drawing, the upper level of catalyst or catalyst-liquid interface is shown as interface 23, and the catalytic reaction zone 22 extends from grid tray 18 to level 23. Catalyst particles in catalytic reaction zone 22 move randomly and are uniformly distributed through the entire zone in reactor 10.

At steady state, few catalyst particles rise above catalyst-liquid interface 23. The catalyst depleted zone 29, above the interface 23, is filled with liquid and entrained gas or vapor. Gas and vapor are separated from liquid in the recycle cup 30 to collect and recycle a liquid with a substantially reduced gas and vapor content through recycle conduit 25 of generally circular cross-sectional area. A substantially liquid product may be withdrawn separately from gas and vapor through conduit 24, in which event conduit 40 terminates in a vapor space and is used to withdraw vapor alone. Alternatively gases, vapors, and liquids may be withdrawn together through conduit 40.

The enlarged upper end of recycle conduit 25 is the recycle cup 30. A plurality of vertically directed riser conduits 27 and 28 provides fluid communication between catalyst depleted zone 29 and phase separation zone 39. Gas-entrained liquid moves upwardly through the riser conduits 27 and 28, and upon leaving the upper ends of these riser conduits, a portion of the fluid reverses direction and flows downward through recycle conduit 25 in the direction of arrow 31 to the inlet of recycle pump 20 and thereby is recycled to the lower portion of reactor 10 below grid tray 18. Gases and vapors which are separated from the liquid, rise to collect in the upper portion of reactor 10 and are removed through outlet conduit 40. The gases and vapors removed at this point are treated using conventional means to recover as much hydrogen as possible for recycle to conduit 13.

Reference is made to FIG. 2. FIG. 2 is a cross-sectional view of the FIG. 1 configuration of a single riser conduit 28 which is positioned in recycle cup 30 in reactor 10. Gas-entrained liquid 41 moves upwardly into riser conduit 28 where it contacts helical tangential velocity inducing member 42. In this representation, helical member 42 comprises two 360° turns at 40° from the vertical spiral. Helical member 42 imparts a tangential velocity component to the gas-entrained liquid 41 and directs it tangentially toward cyclone separator 50. Cyclone separator 50 effects a vapor-liquid separation. Separated vapor 65 is directed through conduit 55 to a relatively vapor rich zone such as a vapor zone if a vapor-liquid interface exists within reactor 10. Separated liquid 45 flows downward along the surface toward recycle conduit 25 in the direction of arrow 31.

Reference is made to FIG. 3. In this arrangement gas-entrained liquid 41 is separated into separated vapor 65 and separated liquid 45 by means of tangential velocity inducing member 43. In this arrangement, member 43 comprises axial vanes which induce tangential velocity on gas-entrained liquid 41 and directs it toward cyclone separator 50 for separation between separated vapor 65 and separated liquid 45. In this arrangement the cyclone separator 50 directs the flow of liquid to recycle conduit 25.

SUMMARY OF THE INVENTION

The invention is an improvement in the recycle conduit in combination with a high pressure reaction vessel adapted for reacting fluid hydrocarbon feedstocks with a hydrogen-containing gas at elevated temperatures and pressures in the presence of a bed of particulate solid catalyst, the process referred to in the art as an ebullated bed process. In the ebullated bed process, hydrogen containing gas and feedstock are introduced into the lower end of a generally vertical catalyst containing vessel. They are introduced at sufficient velocity to force the catalyst into random motion and to expand the volume of the catalyst bed to greater than the static volume. The mixture of feedstock, gas and catalyst constitutes a catalytic reaction zone wherein minimum catalyst settling takes place. The upper portion of the catalytic reaction zone is defined by a catalyst depleted zone substantially free of catalyst. A generally vertical recycle conduit is positioned at the top of the catalyst depleted zone. The upper end of the recycle conduit is in fluid communication with a phase separation zone in the upper portion of the reaction vessel. The enlarged upper end of the recycle conduit is spaced from the wall of the reaction vessel to form an annular area permitting fluid flow. Extending through the enlarged upper end of the recycle conduit are a plurality of generally vertical riser conduits of essentially uniform cross-sectional area. The lower ends of the riser conduits are in fluid communication with the catalyst depleted zone below the enlarged upper end of the recycle conduit. The upper ends of the riser conduits are in fluid communication with the phase separation zone above the enlarged upper end of the recycle conduit. The riser conduits are adapted for the flow of fluid therethrough. The lower end of the recycle conduit is in fluid communication with a recycle pump. Liquid is recycled from the solids free zone to the lower end of the catalytic reaction zone by means of the recycle pump. Catalytically reacted hydrocarbon and gas are removed from the upper portion of the vessel.

In the improvement, helical members are positioned in fluid communication with the riser conduits. These helical members impart a tangential velocity component to the liquid-vapor fluid. The fluid is directed toward cyclone separators which effect a vapor-liquid separation. Separated vapor is directed through conduits to the upper portion of the reaction vessel. Separated liquid is directed to the recycle conduit.

DESCRIPTION OF THE PREFERRED EMBODIMENTS

While the invention is applicable to any process for chemically reacting liquid and gaseous materials in the presence of an expanded volume of solid catalyst particles, the invention will be described with particular reference to upgrading of heavy oil, as generally disclosed in U.S. Pat. Nos. Re. 25,770 to Johanson and 4,151,073 to Comolli, both incorporated herein by reference. In particular, the invention is an improvement in U.S. Pat. No. 4,221,653 to Chervenak et al. incorporated herein by reference.

The reactor vessel is divided into three parts, a lower turbulent catalytic reaction zone, an intermediate catalyst depleted zone and an upper phase separation zone. The feed liquid and gas are introduced into the lower end of the catalytic reaction zone, which contains a bed of solid catalyst. Feed rises uniformly through the zone, thereby expanding the catalyst static volume to form what is called an ebullated bed. Liquid and gas pass to the phase separation zone which contains an improved recycle cup for liquid-vapor separation. This improved recycle cup provides effective separation of the vapor and gas portion of the rising liquid-gas mixture, so that a substantially vapor-free liquid portion can be collected and returned through a downcomer conduit to a recirculating means such as a pump, for recycling liquid through the catalytic reaction zone in order to maintain the desired ebullated bed expansion.

The recycle cup has an enlarged upper portion and is preferably conical or frusto-conical in shape, but may be of any shape, such as cylindrical. It is connected to a liquid recycle conduit leading to the recycle pump in the bottom of the reactor. An annular area between the recycle cup and the reactor wall and a plurality of riser conduits receive the liquid and gas in constricted flow and are in fluid communication above and below the recycle cup.

Loss of recycle pump flow has been identified as the cause of collapse in ebullated bed expansion and disruption of the steady state process. Loss of pump flow has been found to be caused by gas entrainment in the recycle pump suction line. The presence of this entrained gas was known to Chervenak et al. (U.S. Pat. No. 4,221,653). The patent states at Col. 9, line 35 that by means of the separator the recycled liquid contained less than 8% gas by volume. Previous to the Chervenak et al. separator, recycle liquid contained up to 20% gas by volume.

Recycle pump instability measured by oscillations in the recycle liquid flow rate has been found to become severe as gas feed rate to the reactor was increased. Conversely, when the gas feed rate was reduced, oscillations in the recycle flow rate subsided, indicating the flow rate had stabilized. The gas entrainment and loss of pump suction has been overcome in industrial practice by limiting the hydrogen feed rate to the reactor. The amount of reduction in gas rate required to stabilize the pump was found to be small indicating a sharp separation efficiency drop-off, confirmed by the data in FIG. 3 of U.S. patent application Ser. No. 06/920,643 filed Oct. 20, 1986, to S. M. Sayles et al., now U.S. Pat. No. 4,810,359 incorporated herein by reference.

Modifications to the recycle cup of U.S. Pat. No. 4,221,653 to Chervenak et al. have been tested to determine if design changes could reduce gas entrainment in the recycle conduit. It was found by experimentation that an additional stage of separation comprising cyclone separators in combination with riser conduits substantially improved liquid-gas separation efficiency over that of riser conduits alone.

The centrifugal force is directly related to the driving force available to effect the separation. Centrifugal force is described by the equation:

$$F_c = \frac{\text{dens } V_t^2}{r g}$$

wherein $F_c$ is centrifugal force (lb$_f$/ft$^3$), dens is the density of the fluid (lb$_m$/ft$^3$), Vt is the tangential velocity (ft/sec.), r is the radius of the riser conduit (ft) and g is the conversion factor 32.17 lb$_m$ ft/lb$_f$sec$^2$.

It is immediately apparent that the centrifugal force, and therefore the driving force available for separation is inversely proportional to the riser conduit radius. From design calculations and engineering judgment Applicants have concluded that 2 to 3 inch radius riser conduits provide a practical design in combination with 4 inch radius cyclone separators. The preferred embodiment comprises internal helical members of two 360° turns with a surface 40° from vertical. Thirty two of these assemblies are positioned in a 5 ft. radius recycle conduit.

EXAMPLE 1

A scale model was constructed of half-round recycle cup comprising four riser conduits. A Plexiglas ® sheet hydraulically sealed the recycle cup and allowed for photography of the scale model during experimentation.

In this example, riser conduits were tested with helical inserts according to FIG. 2. The helical inserts comprised two 360° turns at 40° from the vertical spiral. In comparison, another test run was made without the helical inserts and cyclone separators.

| Run No. | 17A-1 | 16B | 37B |
|---|---|---|---|
| No. of Helices and Cyclones | 0 | 4 | 4 |
| Reactor Feed Gas SVV, ft/sec | 0.1896 | 0.1952 | 0.5404 |
| Reactor Feed Liquid, gpm | 17.63 | 17.55 | 13.65 |
| Ebullating Pump Liquid, gpm | 49.27 | 47.27 | 44.73 |

-continued

| Run No. | 17A-1 | 16B | 37B |
|---|---|---|---|
| Gas Holdup | | | |
| Reactor, Vol % | 33.92 | 31.2 | 47.87 |
| Downcomer, Vol % | 29.69 | 0.8 | 0.67 |
| Separation Efficiency, % | 12.47 | 97.43 | 98.6 |

At comparable feed gas and liquid rates (Runs 17A-1 and 16B) the riser conduits with the helical inserts and cyclones gave better gas-liquid separation efficiency. Run 37B shows the separation efficiency was high even when the reactor feed gas rate was 277 percent of Run 16B.

EXAMPLE 2

Example 1 was repeated with helical members replaced with axial vanes external to the riser conduits and cyclone separators according to FIG. 3 known in the art as axial vane cyclones. The results of run number 17A-1 are duplicated here for comparison.

| Run No. | 17A-1 | 16C | 25C |
|---|---|---|---|
| Number of Axial Vane Cyclones | 0 | 4 | 4 |
| Reactor Feed Gas SVV, ft/sec | 0.1896 | 0.1868 | 0.2860 |
| Reactor Feed Liquid, gpm | 17.63 | 18.37 | 18.37 |
| Ebullating Pump Liquid, gpm | 49.27 | 43.39 | 47.00 |
| Gas Holdup | | | |
| Reactor, Vol % | 33.92 | 29.76 | 35.16 |
| Downcomer, Vol % | 29.69 | 0.61 | 0.62 |
| Separation Efficiency, % | 12.47 | 97.93 | 98.23 |

At comparable feed gas and liquid rates (Runs 17A-1 and 16C) the riser tubes with the axial vane cyclone gave better gas-liquid separation efficiency. Run 25C shows the separation efficiency was high even when the reactor feed gas rate was 153 percent of that in Run 16C.

While particular embodiments of the invention have been described, it is well understood that the invention is not limited thereto since modifications may be made. For example, liquid level in the recycle cup can be adjusted to optimize separation efficiency. It is therefore contemplated to cover by the appended claims any such modifications as fall within the spirit and scope of the claims.

What is claimed is:

1. A liquid degaser in combination with a high pressure reaction vessel adapted for the reaction of a fluid hydrocarbon feed with a hydrogen rich gas at elevated temperatures and pressures in the presence of a bed of a particulate solid catalyst, said reaction being the type wherein the gas and hydrocarbon feed are passed upwardly through the bed at velocities whereby the bed is expanded to a volume greater than its static volume and the particulate solid catalyst is put in a state of random motion and wherein the mixture of hydrocarbon feed, gas and catalyst constitute a catalytic reaction zone wherein minimum catalyst settling takes place, the upper portion of which is defined by a catalyst depleted zone substantially free of catalyst the upper portion of said catalyst depleted zone is defined by said liquid degaser comprising:

a generally vertical recycle conduit having an enlarged upper end in fluid communication with a phase separation zone and a lower end in fluid communication with means for recycling liquid from the catalyst depleted zone to the lower end of the catalytic reaction zone and a plurality of generally vertical riser conduits adapted for fluid flow therethrough extending through the enlarged upper end having lower ends in fluid communication with said catalyst depleted zone and upper ends, the improvement to the recycle conduit comprising:

(a) helical members within said riser conduits, and
(b) cyclone separators in direct fluid communication with said riser conduit upper ends.

2. A liquid degaser in combination with a high pressure reaction vessel adapted for the reaction of a fluid hydrocarbon feed with a hydrogen rich gas at elevated temperatures and pressures in the presence of a bed of a particulate solid catalyst, said reaction being the type wherein the gas and hydrocarbon feed are passed upwardly through the bed at velocities whereby the bed is expanded to a volume greater than its static volume and the particulate solid catalyst is put in a state of random motion and wherein the mixture of hydrocarbon feed, gas and catalyst constitute a catalytic reaction zone wherein minimum catalyst settling takes place, the upper portion of which is defined by a catalyst depleted zone substantially free of catalyst the upper portion of said catalyst depleted zone is defined by said liquid degaser comprising;

a generally vertical recycle conduit having an enlarged upper end in fluid communication with a phase separation zone and a lower end in fluid communication with means for recycling liquid from the catalyst depleted zone to the lower end of the catalytic reaction zone and a plurality of generally vertical riser conduits extending through the enlarged upper end having lower ends in fluid communication with said catalyst depleted zone and upper ends, the improvement to the recycle conduit comprising:

(a) tangential velocity inducing members in direct fluid communication with said riser conduit upper ends, and
(b) cyclone separators in direct fluid communication with said tangential velocity inducing members.

* * * * *